(12) United States Patent
Henell (10) Patent No.: US 10,558,277 B2
(45) Date of Patent: Feb. 11, 2020

(54) FOLDING ANGLE SENSING OF A FOLDABLE DEVICE

(71) Applicant: Microsoft Technology Licensing, LLC, Redmond, WA (US)

(72) Inventor: Anna-Maria Henell, Helsinki (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 61 days.

(21) Appl. No.: 15/228,237

(22) Filed: Aug. 4, 2016

(65) Prior Publication Data
US 2018/0039339 A1 Feb. 8, 2018

(51) Int. Cl.
*G06F 3/0346* (2013.01)
*G06F 1/16* (2006.01)
*H05K 5/00* (2006.01)
*H05K 5/02* (2006.01)

(52) U.S. Cl.
CPC ............ *G06F 3/0346* (2013.01); *G06F 1/163* (2013.01); *G06F 1/1618* (2013.01); *G06F 1/1626* (2013.01); *H05K 5/0086* (2013.01); *H05K 5/0226* (2013.01)

(58) Field of Classification Search
CPC .... G06F 3/0346; G06F 1/1618; G06F 1/1626; G06F 1/163; H05K 5/0086; H05K 5/0226
See application file for complete search history.

(56) References Cited

U.S. PATENT DOCUMENTS

| 4,095,903 | A | 6/1978 | Feichtinger |
| 4,768,290 | A | 9/1988 | Cooper |
| 6,976,861 | B2 | 12/2005 | McWilliam et al. |

(Continued)

FOREIGN PATENT DOCUMENTS

| CN | 101061693 A | 10/2007 |
| EP | 1867958 A2 | 12/2007 |

(Continued)

OTHER PUBLICATIONS

Khalilbeigi, et al., "FoldMe: Interacting with Double-sided Foldable Displays", In Proceedings of the Sixth International Conference on Tangible, Embedded and Embodied Interaction, Feb. 19, 2012, pp. 33-40.

(Continued)

*Primary Examiner* — Towfiq Elahi (57) ABSTRACT

An electronic device is disclosed, the device comprising a first portion, a hinge element disposed between the first portion and the second portion so that the first portion is rotatable with respect to the second portion, and a non-extensible element disposed between the first portion and the second portion, wherein the non-extensible element comprises a movable portion configured so that a rotation of the first portion with respect to the second portion causes motion of the movable portion with respect to the first portion. The electronic device further comprises a sensor arrangement disposed on the first portion, the sensor arrangement being configured to detect the motion of the movable portion, at least one processor, and at least one memory comprising computer program code configured to calculate an angle of fold between the first and second portion based on the motion of the movable portion as detected by the sensor arrangement.

20 Claims, 7 Drawing Sheets

(56) References Cited

U.S. PATENT DOCUMENTS

| | | |
|---|---|---|
| 7,239,898 B2 | 7/2007 | Lenchik et al. |
| 7,561,203 B2 | 7/2009 | Pistemaa et al. |
| 7,612,559 B2 | 11/2009 | Koivuaho |
| 8,331,554 B2 | 12/2012 | Oliver |
| 8,543,166 B2 | 9/2013 | Choi et al. |
| 8,705,229 B2 | 4/2014 | Ashcraft et al. |
| 8,731,387 B2 | 5/2014 | Boswell et al. |
| 9,007,306 B2 | 4/2015 | Liu |
| 9,207,818 B2 | 12/2015 | Kang et al. |
| 9,304,348 B2 | 4/2016 | Jang |
| 2004/0110529 A1 | 6/2004 | Watanabe et al. |
| 2004/0266502 A1 | 12/2004 | Holtorf et al. |
| 2006/0274897 A1* | 12/2006 | Nakayama ............ G06F 21/57 380/270 |
| 2010/0151902 A1 | 6/2010 | Richardson et al. |
| 2011/0169754 A1* | 7/2011 | Miyazawa ............ G06F 1/1616 345/173 |
| 2013/0100053 A1 | 4/2013 | Kang et al. |
| 2013/0286562 A1 | 10/2013 | Nakajima |
| 2014/0035869 A1 | 2/2014 | Yun et al. |
| 2014/0298062 A1* | 10/2014 | Lee ..................... G01R 33/07 713/323 |
| 2014/0320393 A1 | 10/2014 | Modarres et al. |
| 2015/0116608 A1 | 4/2015 | Jeong |
| 2015/0153905 A1* | 6/2015 | Wang ................... G06F 3/0428 345/175 |
| 2015/0169091 A1 | 6/2015 | Ho et al. |
| 2015/0338888 A1* | 11/2015 | Kim ..................... G06F 1/1677 345/156 |
| 2015/0370396 A1 | 12/2015 | Hotelling et al. |
| 2017/0131118 A1* | 5/2017 | Kauhaniemi ......... G01D 5/145 |

FOREIGN PATENT DOCUMENTS

| | | | |
|---|---|---|---|
| WO | 2015102227 A1 | 7/2015 | |
| WO | WO 2015/102227 | * 7/2015 | ........... G06F 3/0346 |

OTHER PUBLICATIONS

Tarun, et al., "PaperTab: An Electronic Paper Computer with Multiple Large Flexible Electrophoretic Displays", In Proceedings of Extended Abstracts on Human Factors in Computing Systems, Apr. 27, 2013, pp. 3131-3134.

Roudaut, et al., "Morphees: Toward High "Shape Resolution" in Self-Actuated Flexible Mobile Devices", In Proceedings of Extended Abstracts on Human Factors in Computing Systems, Apr. 27, 2013, 10 pages.

"International Search Report and Written Opinion Issued in PCT Application No. PCT/US2017/044058", dated Nov. 8, 2017, 10 Pages.

* cited by examiner

FOLDING ANGLE SENSING OF A FOLDABLE DEVICE

BACKGROUND

Electronic devices are available in a range of form factors, foldable electronic devices being one such form factor. For foldable electronic devices, an angle of fold may be determined between at least two portions of the device.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

An electronic device is disclosed. The electronic device comprises a first portion; a second portion; a hinge element or a folding element disposed between the first portion and the second portion so that the first portion is rotatable with respect to the second portion; a non-extensible element disposed between the first portion and the second portion, wherein the non-extensible element comprises a movable portion configured so that a rotation of the first portion with respect to the second portion causes motion of the movable portion with respect to the first portion; and a sensor arrangement disposed on the first portion, the sensor arrangement being configured to detect the motion of the movable portion; at least one processor; and at least one memory comprising computer program code, the at least one memory and the computer program code configured to, with the at least one processor, cause the electronic device to at least perform: calculate an angle of fold between the first and second portion based on the motion of the movable portion as detected by the sensor arrangement.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein:

In FIGS. 1A to 8, the electronic devices are illustrated as schematic drawings. The drawings may not be to scale.

DETAILED DESCRIPTION

The detailed description provided below in connection with the appended drawings is intended as a description of a number of embodiments and is not intended to represent the only forms in which the embodiments may be constructed, implemented, or utilized. Although the embodiments may be described and illustrated herein as being implemented in device such as a smartphone, this is only an exemplary implementation and not a limitation. As those skilled in the art will appreciate, the present embodiments are suitable for application in a variety of different types of foldable computing devices, for example tablet computers, music players etc., wherein an angle of fold is to be determined between at least two portions of the device.

The term 'computer', 'computing apparatus', 'mobile device' is used herein to refer to any device with processing capability such that it can execute instructions. Those skilled in the art will realize that such processing capabilities are incorporated into many different devices and therefore the terms 'computer' and 'computing apparatus' each may include PCs, servers, laptop computers, mobile telephones (including smart phones), tablet computers, media players, games consoles, personal digital assistants and many other devices.

Figure 1A:
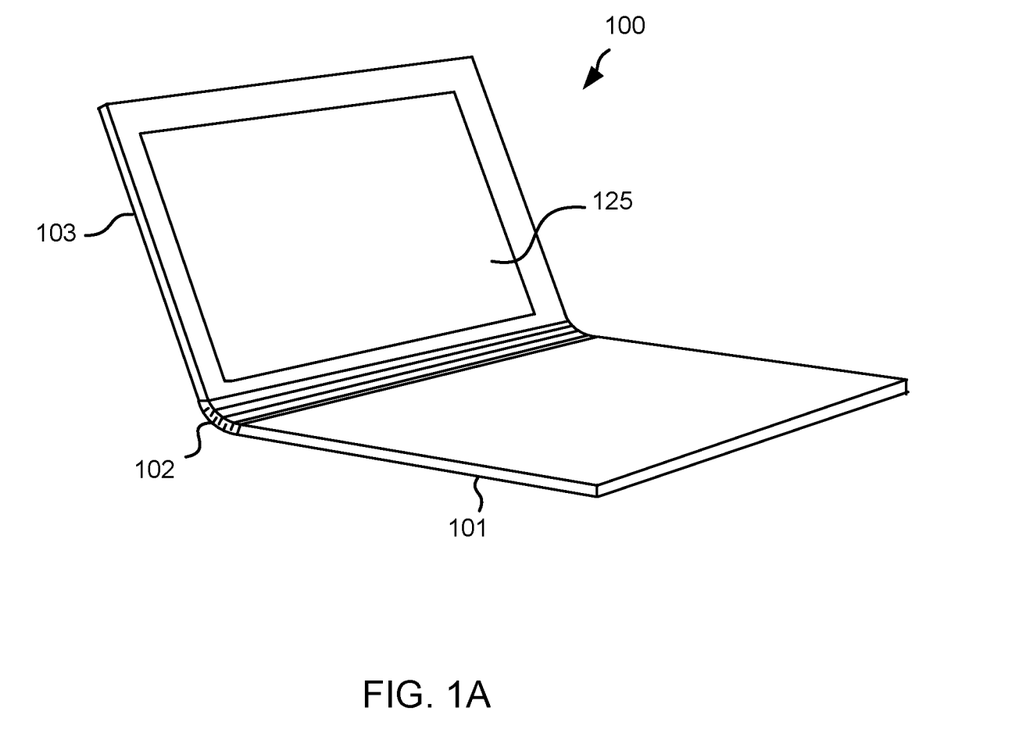
FIGS. 1A and 1B illustrate an electronic device comprising two portions according to an embodiment.

FIG. 1A illustrates an electronic device 100 according to an embodiment. The electronic device 100 may be, for instance, a mobile device, a tablet computer, a smartphone or a mobile phone, a phablet, a media player, a personal digital assistant, an e-book reader, a game console, a wearable device, a display or a flat-screen television. In this embodiment, the electronic device 100 is foldable. It comprises a first portion 101 and a second portion 103 rotatably, e.g. hingedly or foldably, connected by a hinge element 102. According to an embodiment, the hinge element 102 may also be a foldable element. The first portion 101 and the second portion 103 may be separate bodies, joined together by the hinge element 102, or they may be integral parts of the electronic device 100 formed as one single body e.g. by folding the electronic device 100 into two portions. The "hinge element" may refer to any structure providing rotating, folding or hinged movement between the portions about an axis. The hinge element may include any structural element which allows the portions 101 and 103 to fold and/or rotate with respect to each other. This folding and/or rotation may be along or substantially along the edges of portions 101 and 103 which are joined via the hinge. In this exemplary embodiment, the hinge element 102 is a hinge region. The "hinge region" may refer to any structure providing folding or hinged movement between the portions about an axis; the axis may be perpendicular to the length of the electronic device 100. The hinge region 102 may be a region of the electronic device 100 that is more easily foldable than other parts of the electronic device 100. The hinge region 102 may be any type of hinge region, for instance a live hinge. Further, the electronic device 100 may comprise one, two or more hinge elements, i.e. a plurality of hinge elements.

The hinge element may allow various degrees of freedom of rotation or folding between the first and second portions 101 and 103. According to an embodiment, the hinge element 102 may provide freedom of rotation from 0 degrees to 180 degrees between the portions 101 and 103, allowing the device to be rotatable or foldable between a completely folded position and a flat position. In the completely folded position, the first portion 101 and the second portion 103 face each other and may rest against each other. In the flat position, the electronic device 100 may be substantially planar or planar.

According to another embodiment, the hinge element may provide a freedom of rotation between 0 to 360 degrees.

According to another embodiment, the hinge element 102 may provide freedom of rotation in any range selected from 0 to 360 degrees. According to an embodiment, the hinge element 102 may extend end to end between the edges of the first and second portion 101 and 103. According to another embodiment, the hinge element 102 may join the edges of the first and second portion 101 and 103 only at certain points along the edges.

Figure 1B:
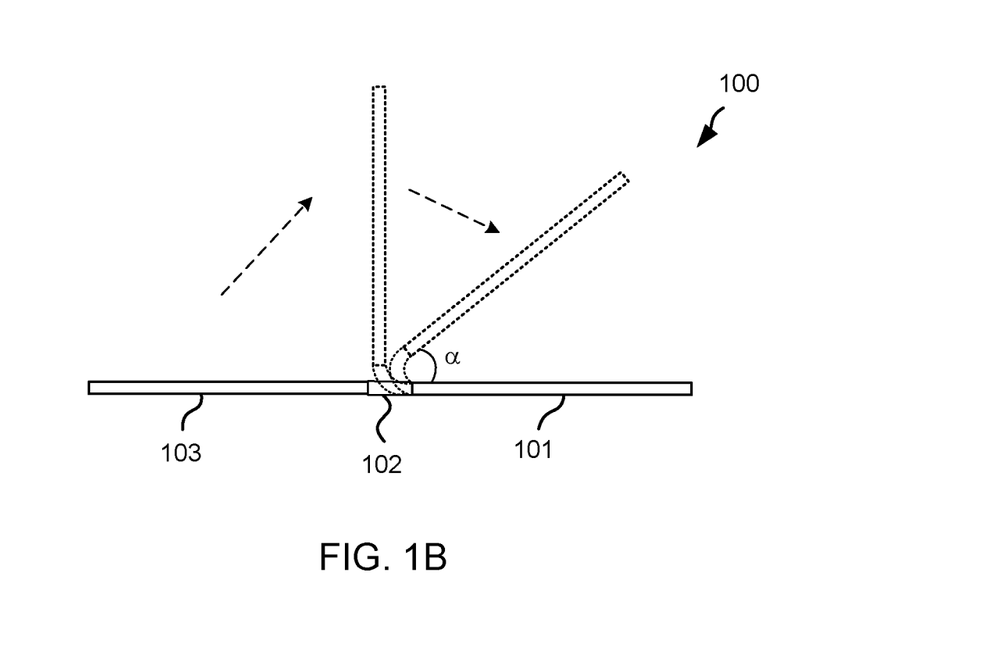

The electronic device 100 further comprises a non-extensible element (not shown in FIGS. 1A and 1B). The non-extensible element may be disposed so that it extends between the first and second portions 101 and 103. The non-extensible element may also partially extend over or within at least a part of the first portion 101 and/or the second portion 103.

The electronic device 100 may further comprise a display 125 configured to provide a graphical user interface. The display 125 may be a touch sensitive display. In an embodiment, the electronic device 100 is a mobile device, and the display 125 is a touch sensitive display.

FIG. 1B illustrates the electronic device 100 as a side view and some examples of angles of fold. The electronic device 100 is foldable between a flat position and a folded position. The first portion 101 is, as described above, rotatable or foldable with respect to the second portion 103, with an angle of fold a between the first portion 101 and the second portion 103 in the folded position. The electronic device 100 may be configured to determine the angle of fold a as described below. The electronic device 100 may further comprise a computing apparatus, such as at least one processor and at least one memory comprising computer program code, the computing apparatus being configured to calculate the angle of fold a as described below. When in use, at least one characteristic of the graphical user interface presented on the display 125, such as a touch-sensitive display (not visible in the side view of FIG. 1B) may be transformed based on a change in the angle of fold between the first portion and the second portion.

In the flat position, the angle between the first and second portions 101 and 103 is 180 degrees or substantially 180 degrees. According to an embodiment, substantially 180 degrees refers to an angle of 180 degrees±5 degrees. The hinge element 102 may comprise one or more hinges (not illustrated in FIG. 1B) which enable rotation, folding or pivoting motion. According to an embodiment, the hinge element may comprise a pin and a sleeve. According to an embodiment, the hinge element 102 may comprise a multi-stage hinge element, so that rotation or folding occurs along multiple closely spaced parallel axes. According to an embodiment, the hinge element 102 may be such that it maintains the first and second portions 101 and 103 at an angle of fold set by a user. According to an embodiment, the hinge element may employ friction to maintain the first and second portions 101 and 103 at an angle set by the user.

According to an embodiment, the electronic device 100 may comprise a touch or a gesture sensitive display covering at least a part of the first and second portions 101 and 103 and the hinge element 102. According to another embodiment, the first and second portions 101 and 103 may comprise two separate touch or gesture sensitive displays. According to an embodiment, a touch or gesture sensitive display may comprise one or more touch sensitive display panels. According to an embodiment, the electronic device 100 may comprise at least one input device. Such input devices may include keyboards, touchpads, trackpads, tracker balls, cameras, microphones etc.

According to an embodiment, the user interface of the electronic device 100 may be configured to change based on the determined angle of fold. According to an embodiment, the at least one memory and the computer program code are configured to, with the at least one processor, cause the electronic device to at least perform: transform at least one characteristic of the graphical user interface presented on the display based on a change in the angle of fold between the first portion and the second portion. According to another embodiment, the characteristic of the graphical user interface may include one or more display parameters. According to another embodiment, the characteristic of the graphical user interface may include one or more graphical components of the user interface. According to another embodiment, the characteristic of the graphical user interface may include an operational mode of the electronic device 100.

Figure 2A:
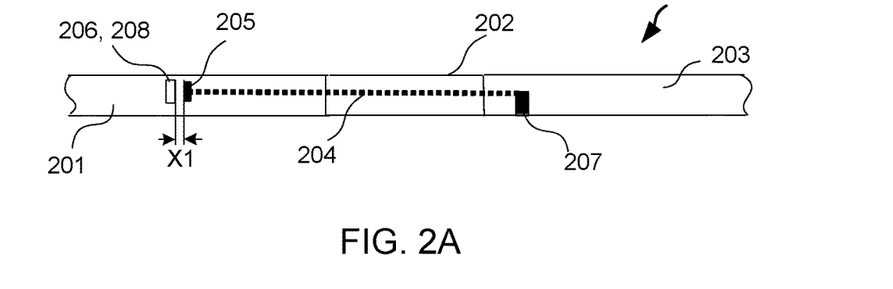
FIGS. 2A, 2B and 2C illustrate alternative schematic side views of an electronic device according to an embodiment in various positions.
Figure 2B:
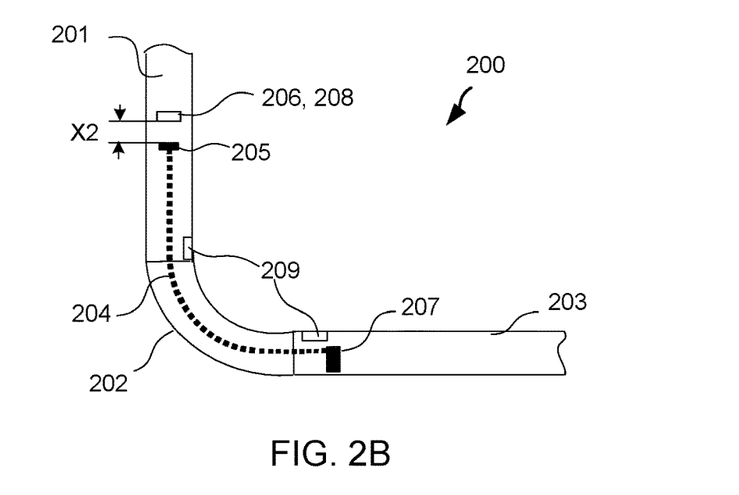
Figure 2C:
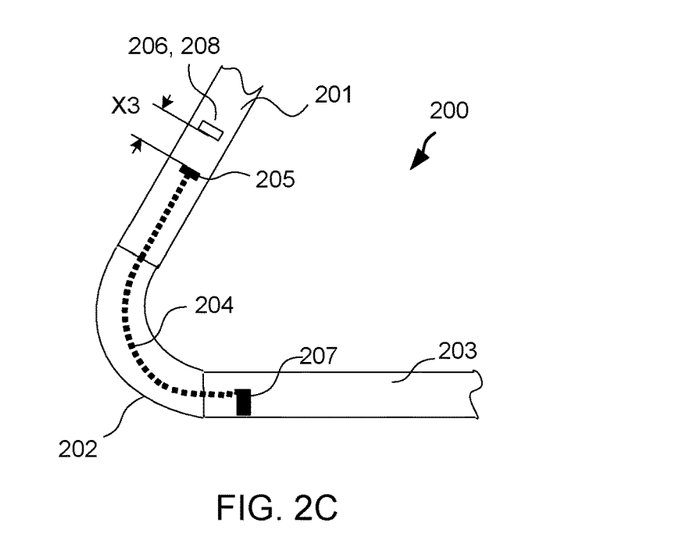

FIGS. 2A to 2C illustrate a sectional side view of an electronic device 200 according to an embodiment rotated or folded to various degrees. Referring to FIG. 2A, FIG. 2B, and FIG. 2C, the electronic device 200 comprises two portions, a first portion 201 and a second portion 203, joined to each other by a hinge element 202. A non-extensible element 204 is disposed between the first and second portions 201 and 203 and extends along or within at least a part of the first and second portions 201, 203. An end of the non-extensible element 204 is fixed by an attachment arrangement 207 to and within the second portion 203, but another end is free to move longitudinally within the first portion 201. A movable portion 205 is disposed at the free end of the non-extensible element 204, in this embodiment a movable element. In this embodiment, at least a part of the non-extensible element 204 is disposed within the hinge element 202. The electronic device 200 further comprises a sensor arrangement 206 comprising a sensor 208 disposed within the first portion 201 along the axis of motion of the movable element 205. According to an embodiment, the sensor arrangement may alternatively or in addition comprise a sensor 208 disposed parallel to the axis of motion of the movable element 205 (not shown in FIGS. 2A, 2B, 2C). The sensor arrangement 206 may produce a signal, which may be used to calculate an angle of fold.

In FIG. 2A, the electronic device 200 is in a flat position, i.e. flat with the angle of fold between the first and second portion 201 and 203 being equal or substantially equal to 180 degrees. The distance between a reference point, in this embodiment the sensor 208, and the movable element 205 is X1. A measure of this distance and/or a change in this distance upon movement of the movable element 205 may be determined by the sensor 208.

FIG. 2B differs from FIG. 2A in at least that the electronic device 200 is folded substantially at a 90 degree angle. The non-extensible element 204 may bend and/or flex so that the when in use, the first portion is rotated or folded with respect to the second portion such that the non-extensible element 204 applies a pulling or pushing force on the movable portion or element 205. The movable portion or element 205 is thereby configured to move with respect to the first portion 201. The non-extensible element 204 may be non-compressible, so that it retains its length upon rotation or folding of the first portion 201 with respect to the second portion 203 regardless of the direction of the rotation or folding, of the angle of fold, and of the direction of the motion of the movable portion or element 205. The non-extensible element 204 may be elongated. The movable portion or portion or element 205 may thus be movable in the direction of the length, i.e. in the direction of the longitudinal axis, of the non-extensible element. Thus the movable portion or element 205 is configured to move away from the sensor 208. Consequently, the sensor 208 may measure the distance or position of the movable portion or element 205 relative to itself or to a reference point, and/or a change in the distance or position. This may be a measure of the distance X2 between the movable portion or element 205 and the sensor 208 or between the movable element 205 and a reference point (not shown in FIGS. 2A to 2C).

FIG. 2C differs from FIGS. 2A and 2B in at least that the electronic device 200 is folded further so that the angle of fold is smaller than in FIG. 2B and so that the distance between the movable element 205 and the sensor 208 is X3. X3 may be determined by the sensor 208. As is clear from the FIGS. 2A to 2C, although the schematic FIGs are not to scale, the distances X1, X2 and X3 are different from each other. X3 is greater than X2, and X2 is greater than X1.

The distances X1, X2 and X3 may be determined by the sensor arrangement 206. After calibration, these distances may be translated to corresponding angles of fold between the first and second portion 203 and 201. Calibration may be done during the assembly of the electronic device or during the operation of the electronic device 200. According to an embodiment, the calibration is done during assembly; the position of the movable portion 205 relative to the sensor arrangement 206 when the electronic device 200 is in the flat position may be mapped to an angle of zero degrees and the position of the movable portion 205 relative to the sensor arrangement 206 when the electronic device 200 is folded to the maximum may be mapped to a minimum possible angle of fold.

According to an embodiment, the minimum possible angle of fold of the electronic device 200 may be zero degrees or substantially zero degrees. According to an embodiment, "substantially zero degrees" refers to an angle of 0 to 5 degrees, or to an angle of 0 to 3 degrees. According to an embodiment, the electronic device 200 may be folded to angle of fold of 180 degrees, and further to angle of fold of 360 degrees. According to another embodiment, calibration may be done during operation. A user of the electronic device 200 may be asked by the electronic device, via a user interface, to fold the electronic device to different degrees and corresponding relative positions may be measured by the sensor arrangement 206. These fields may be mapped to the angles of folding specified by the electronic device 200 to the user.

In some embodiments in which the hinge element 202 may provide a freedom of rotation or folding between 180 and 360 degrees, i.e. in which the angle of fold may be greater than 180 degrees, the sensor arrangement 206 and the electronic device 200 may not be capable of determining whether the angle of fold is between 0 and 180 degrees or between 180 and 360 degrees based on the motion of the movable portion 205 alone. The electronic device 200 may therefore comprise a secondary sensor arrangement 209 configured to determine whether the angle of fold is greater than 180 degrees, i.e. between 0 and 180 degrees or between 180 and 360 degrees. Such a secondary sensor arrangement 209 may be e.g. a magnetic sensor arrangement configured to determine the relative position of parts of the secondary sensor arrangement 209 connected to the first portion 201 and the second portion 203 to each other. As another example, the secondary sensor arrangement 209 may comprise a switch that is configured to be flipped upon rotation or folding of the first portion 201 with respect to the second portion 203, wherein the angle of fold exceeds 180 degrees.

The non-extensible element may be bendable and/or flexible. The material of the non-extensible element is not particularly limited, and various materials, such as metal, plastic or fabric, or any combination thereof, may be contemplated. The non-extensible element may be or comprise, for example, a wire element, a wire, such as a tension wire, a metal wire, a flexible or bendable rod, a chain element, a chain, a ribbon or another type of element. The non-extensible element may have a length that is predetermined and/or fixed. The length of the non-extensible element thus does not change upon rotation or folding of the first portion 201 with respect to the second portion 203.

The movable portion or element 205 may be configured to move a suitable distance. The distance may be in the range of 1 µm to 5 mm, or in the range of 10 µm to 1 mm. A suitable distance may be selected based on one or more properties, such as the measurements of the electronic device 200, the hinge element 202 or the non-extensible element 204 and/or on the capabilities of the sensor arrangement 206.

The sensor arrangement 206 may be based on any suitable sensor technology. In an embodiment, the sensor arrangement 206 is a proximity sensor arrangement. The proximity sensor arrangement may be configured to detect the relative position or movement of the movable portion 205 without any physical contact. The proximity sensor arrangement 206 may comprise a proximity sensor 208. The proximity sensor 208 may be configured to emit an electromagnetic field or a beam of electromagnetic radiation towards the movable portion 205 and to detect a change in the field or return signal.

According to other embodiments, the sensor arrangement 206 may be, for instance, an optical sensor arrangement, an electrical sensor arrangement, or a magnetic sensor arrangement. Examples of various sensor arrangements are described below. Other sensor arrangements may also be contemplated.

The electronic device may comprise more than one non-extensible elements 204. According to an embodiment, the electronic device comprises two or more non-extensible elements 204 disposed along the axis of rotation or fold of the electronic device 200. In such an embodiment, the electronic device 200 comprises at least one sensor arrangement 206 for each non-extensible element 204, so that the electronic device may comprise two or more sensor arrangements 206. The two or more non-extensible elements 204 may be the same or they may be different; and the two or more sensor arrangements may likewise be the same or they may be different. In such an embodiment, two or more data points may be obtained for calculating an angle of fold, which may improve accuracy or fault tolerance.

Figure 3:
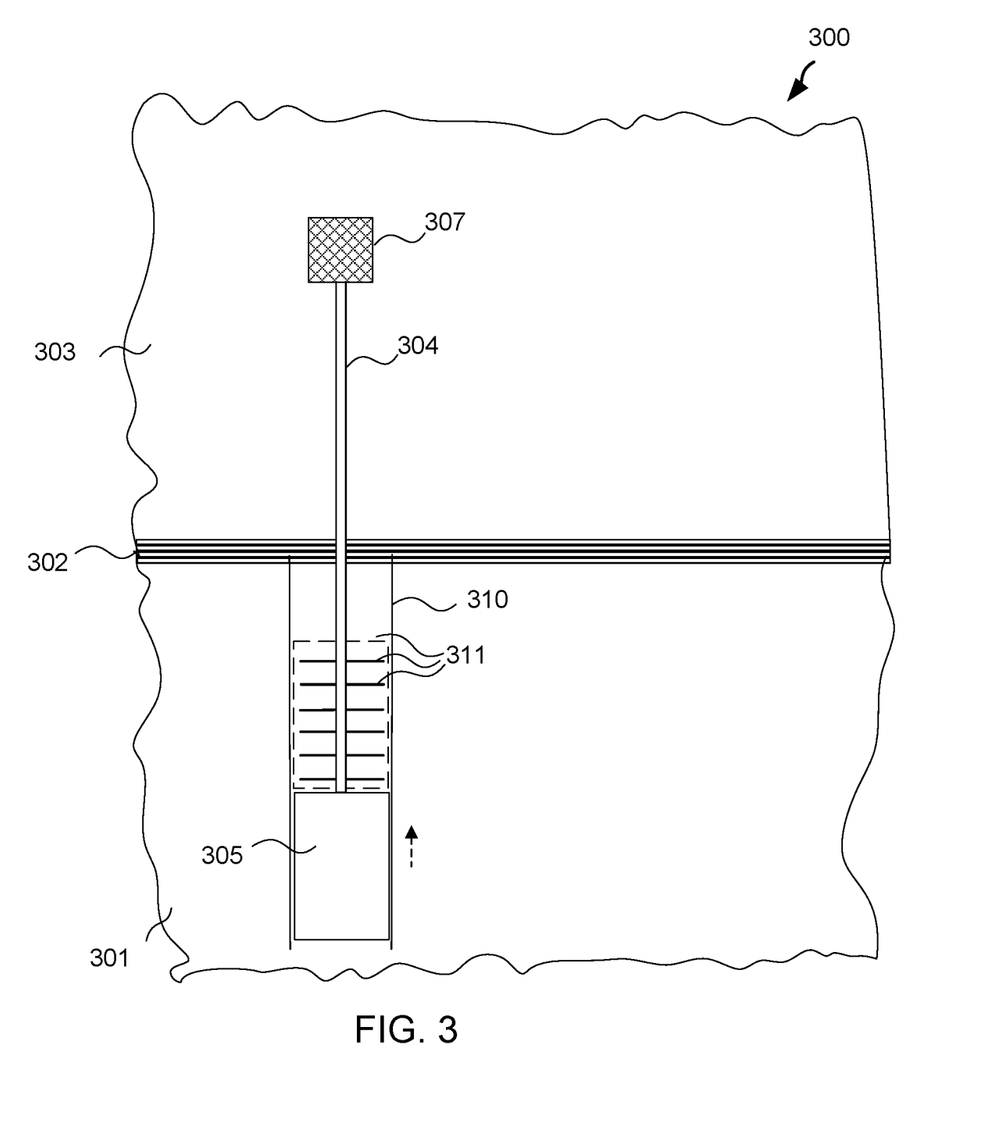
FIG. 3 illustrates a schematic top view of an electronic device in a flat position.

FIG. 3 illustrates a top sectional view of a part of an electronic device 300 according to an embodiment. The electronic device 300 comprises a first portion 301 and a second portion 303, joined foldably or hingedly to each other by a hinge element 302. A non-extensible element 304 is disposed between the first and second portions 301 and 303 and extends between them. The non-extensible element 304 may be fixed to the second portion 303 at one end to prevent any motion on the side of the second portion 303, while the other end may be configured so as to allow longitudinal motion, i.e. motion in the direction that the non-extensible element extends. According to an embodiment, the end of the non-extensible element 304 at the side of the second portion 303 may be fixed by means of an attachment arrangement 307. The attachment arrangement 307 may be any arrangement, structure or element capable of preventing longitudinal motion of the non-extensible element 304 as a whole with respect to the second portion 303. The attachment arrangement 307 may be adhesion based, mechanical, electro-mechanical or any combination of these, for instance a bracket, a clamp, a clip, a rivet, a pin, an adhesive, or a magnetic attachment arrangement.

At the free end, the non-extensible element 304 comprises a movable portion 305. In this exemplary embodiment, the movable portion 305 is a movable element 305 at the free end of the non-extensible element 304. The movable element 305 is shown in FIG. 3 in its extreme position. This is the position it may be configured to be when the electronic device 300 is rotated or folded in the flat position (the angle of fold is 180 degrees or substantially 180 degrees) or the position in which the angle of fold is as close to 180 degrees as to which the electronic device 300 is configured to be folded. For example, if the electronic device 300 is rotatable or foldable between an angle of fold of 5 and 160 degrees, the movable element 305 is in its extreme position when the electronic device 300 is rotated or folded to an angle of 160 degrees. In FIG. 3 the dashed line marks the position in which the movable element 305 is when the electronic device 300 is folded to its smallest possible angle of fold.

The electronic device 300 may further comprise a guide structure 310, so that the movable portion or element 305 is movable along the guide structure 310. In this embodiment, the guide structure 310 extends within the first portion 301. In other embodiments, the guide structure 310 may also extend within the second portion 303 and/or within the hinge element 302. The movable element 305 may be disposed such that when the non-extensible element 304 applies a pulling or pushing force on it, it moves longitudinally along the guide structure 310. The guide structure 310 may be any structure restricting motion of the movable element 305 to motion along a guide line. The guide structure 310 may restrict or prevent the motion of the movable element 305 in the lateral direction. According to an embodiment, such a guide structure may include a passage such as a tunnel or a channel in the material surrounding the movable element 305. According to another embodiment, the movable element 305 may have grooves or raised lines on one or more of its surfaces, with corresponding raised lines or grooves in at least one surface inside or on the guide structure 310, for instance inside or on a guide passage extending within the first portion 301. In the exemplary embodiment of FIG. 3, the guide structure 310 is a guided track extending within the first portion 301 guiding the movement of the movable element 305 towards the second portion 303 on in the direction opposite thereof.

In the embodiment of FIG. 3, the sensor arrangement is an optical sensor arrangement (not shown in this sectional view). The guide structure 310 has a plurality of markings 311 along the direction in which the movable element 305 is configured to move upon rotation of the first portion 301 with respect to the second portion 303. When in use, the first portion 301 may be rotated with respect to the second portion 303, and the movable element 305 may thus move a distance depending on the angle of fold between the portions 301, 303. Depending on the distance the movable element 305 is configured to move, it may be configured to cover one or more of the plurality of markings 311 on the guide structure 310 upon rotation of the first portion 301 with respect to the second portion 303. The optical sensor arrangement may be configured to detect the markings 311, i.e. their visibility, and based thereon the movement and/or relative position of the movable element 305. The optical sensor arrangement may comprise an optical sensor, which may be disposed opposite to the guided track 310 and the markings 311. The optical sensor arrangement may be configured to detect the markings 311 and the movement and/or relative position of the movable element 305 using image recognition or any other suitable mechanism.

In an embodiment, there may be one or two markings 311 instead of a plurality of markings 311, and the optical sensor arrangement may be configured to detect the movement and/or position of the movable portion or element 305 relative to the marking(s) 311. In such an embodiment, the marking(s) 311 may function as a reference point for the detection of movement of the movable portion or element 305.

Figure 4A:
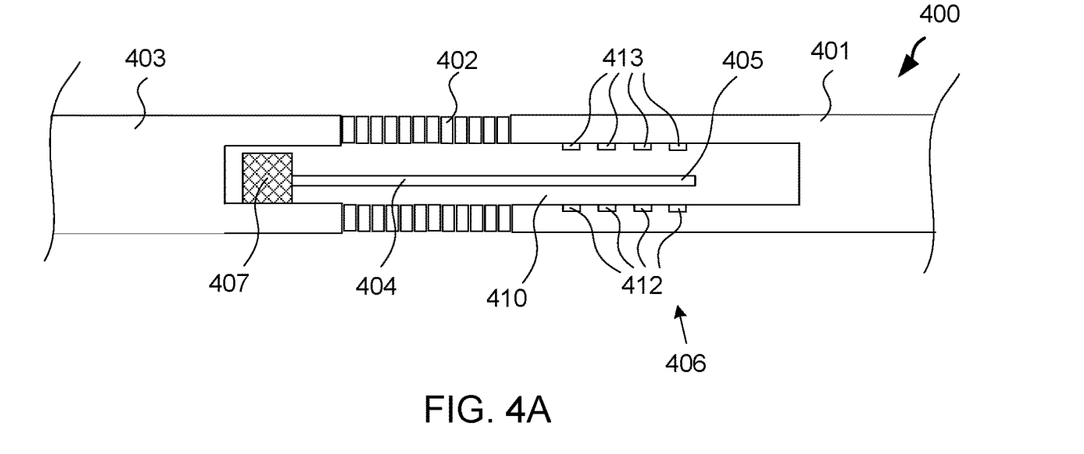
FIGS. 4A, 4B, 5 and 6 illustrate schematic sectional side views of electronic devices according to various embodiments in a flat position.

FIG. 4A illustrates another embodiment employing an optical sensor arrangement 406, shown as a sectional side view of a part of an electronic device 400. In this embodiment, the entire non-extensible element 404 is disposed within the electronic device 400 so that it extends within and is covered by a part of the first and second portions 401, 403 and the hinge element 402. A guide structure 410, in this embodiment a longitudinal guide passage, extends a distance within the first portion 401, a distance within the second portion 403 and throughout the hinge element 402. In this embodiment, the non-extensible element 404 does not comprise a movable element as a separate body but rather a movable portion 405 which is a part of the non-extensible element 404, the entire non-extensible element 404 being monolithic. However, in other embodiments, the non-extensible element may comprise a movable element 405 such as the movable element described in FIG. 3. The non-extensible element 404 is attached and thereby fixed to the second portion 403 via an attachment arrangement 407, which may be any attachment arrangement described in this specification. In this sectional view, the electronic device 400 is shown in the flat position, i.e. the angle of fold between the first portion 401 and the second portion 403 is substantially 180 degrees.

The optical sensor arrangement 406 comprises a plurality of optical sensors 412. The optical sensors 412 may be photodiodes, but other types of optical sensors may also be contemplated. The electronic device 400 further comprises a plurality of light sources 413 disposed opposite to the optical sensors 412, i.e. at an opposite side of the guide structure 410. The light sources 413 may be light-emitting diodes (LEDs), but other types of light sources may also be contemplated. The light sources 413 are configured to emit light, which the optical sensors 412 are configured to detect. The movable portion 405, when extending between at least one of the light sources 413 and at least one of the optical sensors 412, may block the light emitted by the light sources 413 from reaching the optical sensors 412. In the flat position, the movable portion 405 may extend between some or all of the light sources 413 and optical sensors 412. As the movable portion 405 moves along the guide structure 410 upon rotation of the first portion 401 with respect to the second portion 403, it may move so that it no longer extends between one or more of the light sources 413 and the optical sensors 412, for instance one or more of the light sources 413 and the optical sensors 412 farthest away from the second portion 403.

The optical sensor arrangement 406 may thus be configured to detect the amount of light reaching and/or detected by the optical sensor(s) 412 and based thereon detect the movement and/or relative position of the movable portion 405. Instead of a plurality of individual light sources 413 and optical sensors 412, an electronic device comprising a single light source and a single optical sensor may also be contemplated. Such a single optical sensor may be configured to detect the amount of light reaching it, the amount of light reaching it depending on the movement of the movable portion 405. The optical sensor(s) 412 may be disposed along a longitudinal axis of motion of the movable portion 405, i.e. in this embodiment at a lateral side of the guide structure 410.

In general, the guide structure 410 does not need to extend in and the motion of the movable portion 405 does not need to be towards only a certain direction. According to an embodiment, the guide structure 410 may be implemented in various different directions inside the portions 401, 403 and the hinge element 402. For example, the guide structure 410 may be transversal with respect to an axis of rotation or folding the electronic device 400. According to an embodiment, the guide structure 410 is perpendicular with respect to an axis of rotation of folding the electronic device 400. Furthermore, according to an embodiment, the guide structure 410 may be straight, curved, or partially curved and partially straight. The guide structure 410 also does not need to be longitudinal. The inside dimensions of the guide structure 410, for instance a longitudinal passage, may be substantially the same or greater as the dimensions of the movable portion 405.

Other aspects of the embodiment shown in FIG. 4A are generally similar to those of the embodiments shown in FIGS. 2 and 3.

Figure 4B:
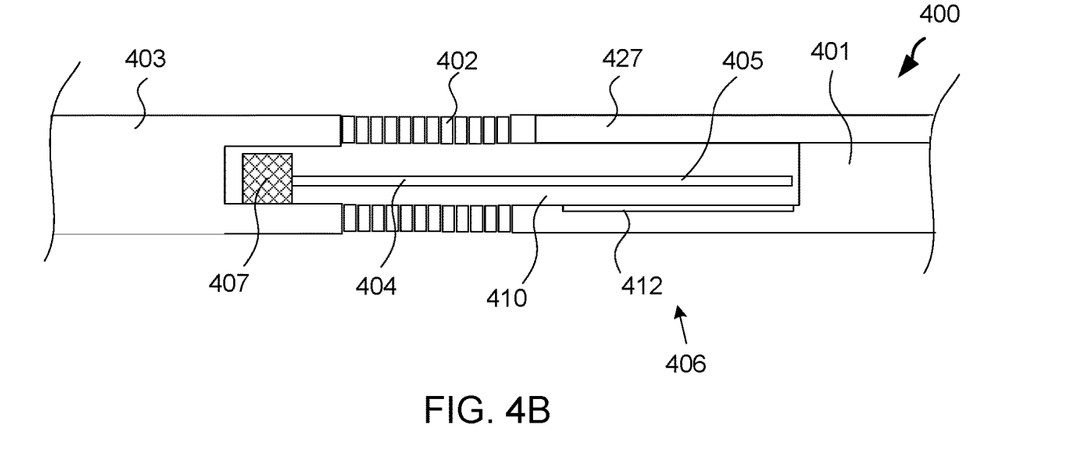

FIG. 4B illustrates another embodiment employing an optical sensor arrangement 406 as a sectional view of a part of an electronic device 400. FIG. 4B differs from FIG. 4A at least in that the first portion 401 comprises an area or element 427 capable of transmitting light, for instance ambient light, from the outside of the electronic device 400 towards a sensor arrangement 406 and to an optical sensor 412 capable of detecting the light. In this embodiment, the area or element 427 is a window or another optical element which is at least partially transparent in the visible wavelength range so that at least a part of visible light incident on the window or optical element may be transmitted through it. The window or optical element may be formed, for example, of a plastic or glass material. The optical sensor 412 may be configured to detect the amount of light reaching it, the amount of light reaching it depending on the motion of the movable portion 405. According to another embodiment, the first portion 401 may have an opening instead of an element 427, so that at least a part of visible light incident in the opening may be transmitted through it. Other aspects of the embodiment shown in FIG. 4B are generally similar to those of the embodiments shown in FIGS. 2, 3 and 4B.

Figure 5:
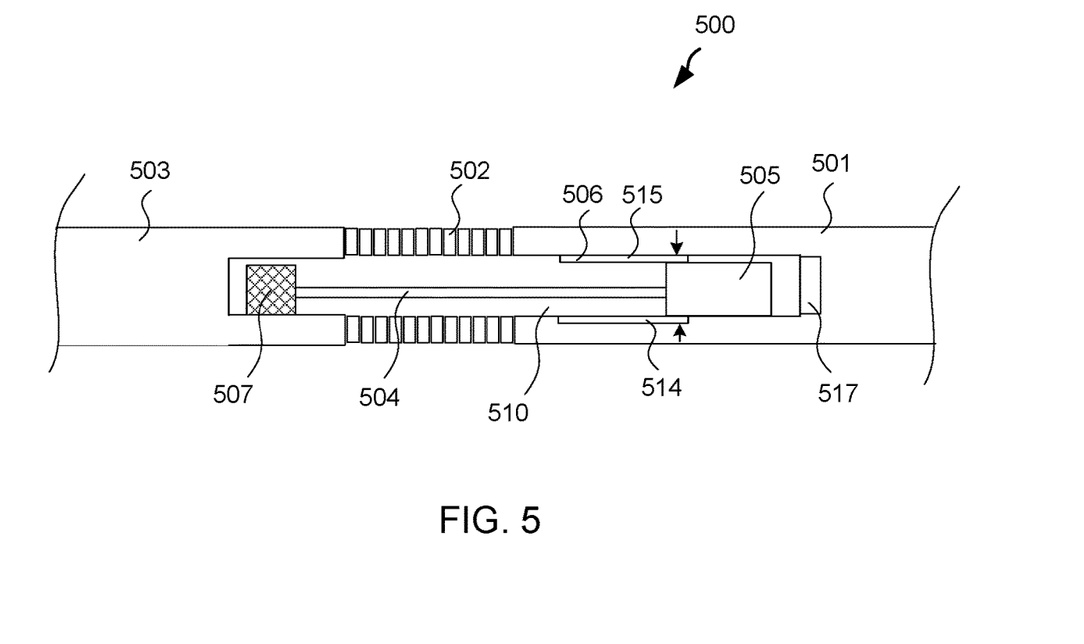

FIG. 5 illustrates an embodiment employing an electrical sensor arrangement 506 as a sectional side view of a part of an electronic device 500. A hinge element 502 is disposed between the first portion 501 and the second portion 503. The electrical sensor arrangement 506 is configured to measure an electrical quantity, in this embodiment resistance. The movable element 505 of this exemplary embodiment is formed of an electrically conductive material and connected to the non-extensible element 504. The non-extensible element 504 is attached and thereby fixed to the second portion 503 via an attachment arrangement 507, which may be any attachment arrangement described in this specification. The electronic device 500 further comprises a conductive element 514 connected to the first portion 501. The conductive element 514 may be a conductive plate. The conductive element 514 is disposed so that it is configured to be in contact with the movable element 505 when the movable element 505 is moving. In this embodiment, the conductive element 514 is arranged within the guide structure 510. The movable element 505 is configured to be in contact with the conductive element 514 when moving along the guide structure 510. The electrical sensor arrangement 506 further comprises an electrode 515 disposed so that it is configured to be in contact with the movable element 505 when the movable element 505 is moving. The electrode 515 is disposed at the opposite side of the guide structure 510 and thus opposes the conductive element 514. The electrical sensor arrangement 506 may further comprise other components that are not visible in this sectional view, the other components allowing the measurement of resistance across the movable element 505 and the conductive element 514. Upon rotation of the first portion 501 with respect to the second portion 503, the movable element 505 moves with respect to the conductive element 514 so that the area of contact between the movable element 505 and the conductive element 514 changes, thereby changing the electrical resistance across the movable element 505 and the conductive element 514. Thus the electrical sensor arrangement 506 is configured to detect the motion and/or relative position of the movable element 505.

In this embodiment, the electronic device 500 further comprises a restricting arrangement 517 configured to restrict, i.e. to resist but not completely prevent, the movement of the movable portion, i.e. the movable element 505. The restricting arrangement 517 may be configured to exert a pulling force to the movable portion or element 505 so that it restricts the movement of the movable portion or element 505 only upon rotation or folding of the first portion 501 with respect to the second portion 503 towards a smaller angle of fold. Upon rotation or folding of the first portion 501 with respect to the second portion 503 towards a greater angle of fold, the restricting arrangement 517 does not restrict the motion of the movable portion or element 505; however, it may exert a pulling force pulling the movable portion or element 505 towards its extreme position, such as the position it is configured to assume when the electronic device 500 is at a flat position. According to an embodiment, the restricting arrangement 517 is configured to restrict the longitudinal movement of the movable portion 505. According to an embodiment, the restricting arrangement 517 is a magnetic restricting arrangement. The restricting arrangement 517 may comprise a magnet configured to exert a pulling force to the movable portion or element 505 so that it restricts the movement of the movable portion or element 505 upon rotation or folding of the first portion 501 with respect to the second portion 503. The movable portion or element 505 may comprise a magnetic element. For instance, the movable portion or element 505 may comprise a ferromagnetic metal. Alternatively, the movable portion or element 505 may comprise a magnet. The restricting arrangement 517 may also comprise a ferromagnetic metal. Although depicted here in the context of the embodiment of FIG. 5, such a restricting arrangement may be included in any electronic device according to any one of the embodiments described in this specification.

According to an embodiment, the restricting arrangement is configured to exert a pulling force to the movable portion or element 505 so that when the electronic device 500 is rotated towards the flat position, the movable portion or element 505 moves towards its extreme position, such as the position it is disposed in when the electronic device 500 is in the flat position.

Other aspects of the embodiment shown in FIG. 5 are generally similar to those of the embodiments shown in FIGS. 2, 3 and 4.

Figure 6:
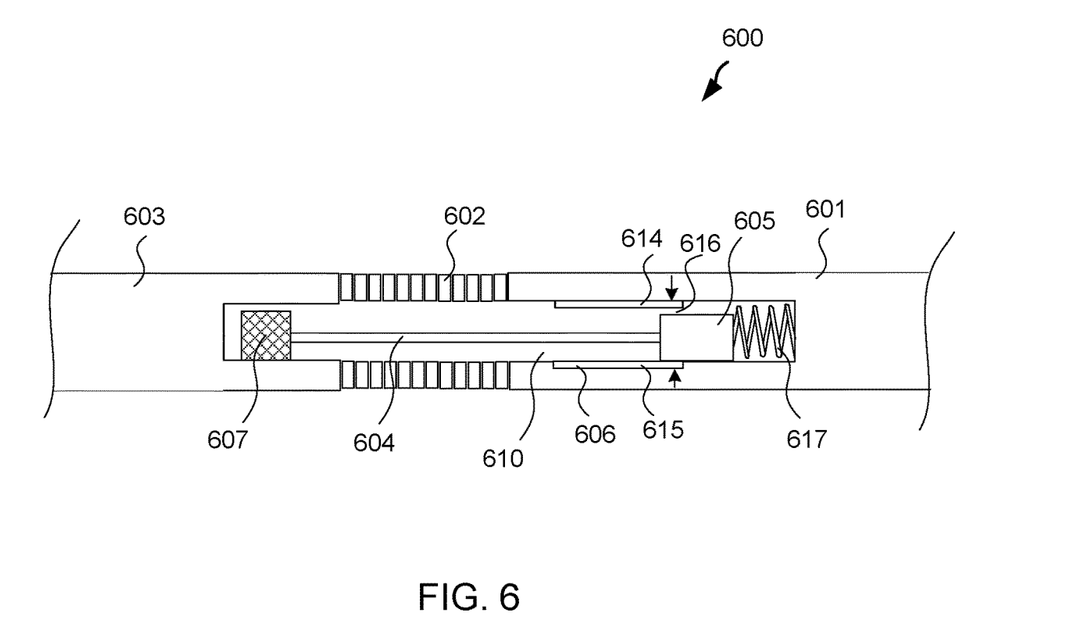

FIG. 6 illustrates an embodiment employing an electrical sensor arrangement 606 as a sectional side view of a part of an electronic device 600. A hinge element 602 is disposed between the first portion 601 and the second portion 603. The electrical sensor arrangement 606 is configured to measure an electrical quantity. The movable element 605 of this exemplary embodiment is connected to the non-extensible element 604. The non-extensible element 604 is attached and thereby fixed to the second portion 603 via an attachment arrangement 607, which may be any attachment arrangement described in this specification. FIG. 6 differs from FIG. 5 in at least that the electrical sensor arrangement 606 is configured to measure capacitance across the movable element 605 and the conductive element 614. In this embodiment, the electrical sensor arrangement 606 comprises an electrode 615 opposite to the conductive element 614, i.e. at an opposite side of the guide structure 610. The electrode 615 may be plate-shaped. The conductive element 614 is separated from the movable element 605 by a dielectric gap 616. The dielectric gap 616 is, in this embodiment, an air gap; however, another suitable dielectric material, such as a thin film of a dielectric material, could also be disposed in the dielectric gap 616 to electrically separate the conductive element 614 and the movable element 605. In embodiments in which the distance between the conductive element 614 and the movable element 605 remains the same along the motion of the movable element 605 upon rotation of the first portion 601 with respect to the second portion 603, only the area of overlap between the movable element 605 and the conductive element 614 changes, thereby changing the capacitance across the movable element 605 and the conductive element 614. Thus the electrical sensor arrangement 606 is configured to detect the motion of the movable element 605.

According to another embodiment, the movable element 605 is dielectric. Such a movable element 605 may be formed of a dielectric material, such as a dielectric plastic material, glass or ceramic. In such an embodiment, the area of overlap between the movable element 605, the electrode 615 and the conductive element 614 changes, thereby changing the capacitance across the movable element 605, the electrode 615 and the conductive element 614. The electrical sensor arrangement 606 may thus be configured to measure capacitance across the movable element 605, the electrode 615 and the conductive element 614.

The electronic device 600 further comprises a restricting arrangement 617 configured to restrict the movement of the movable portion, i.e. the movable element 605. According to an embodiment, the restricting arrangement 617 is a mechanical restricting arrangement. The mechanical restricting arrangement may comprise or be e.g. a spring, such as the helical spring depicted in FIG. 6, but various other types of springs and various other types of mechanical restricting arrangements may also be contemplated. The mechanical restricting arrangement 617 may thus be configured to exert a pulling force to the movable portion or element 605 so that it restricts, i.e. resists but does not completely prevent, the movement of the movable portion or element 605 upon rotation or folding of the first portion 601 with respect to the second portion 603. Although depicted here in the context of the embodiment of FIG. 6, such a restricting arrangement may be included in an electronic device according to any one of the embodiments described in this specification.

Other aspects of the embodiment shown in FIG. 6 are generally similar to those of the embodiments shown in FIGS. 2, 3, 4 and 5. Other types of electrical sensor arrangements configured to measure other electrical quantities may also be contemplated.

Figure 7:
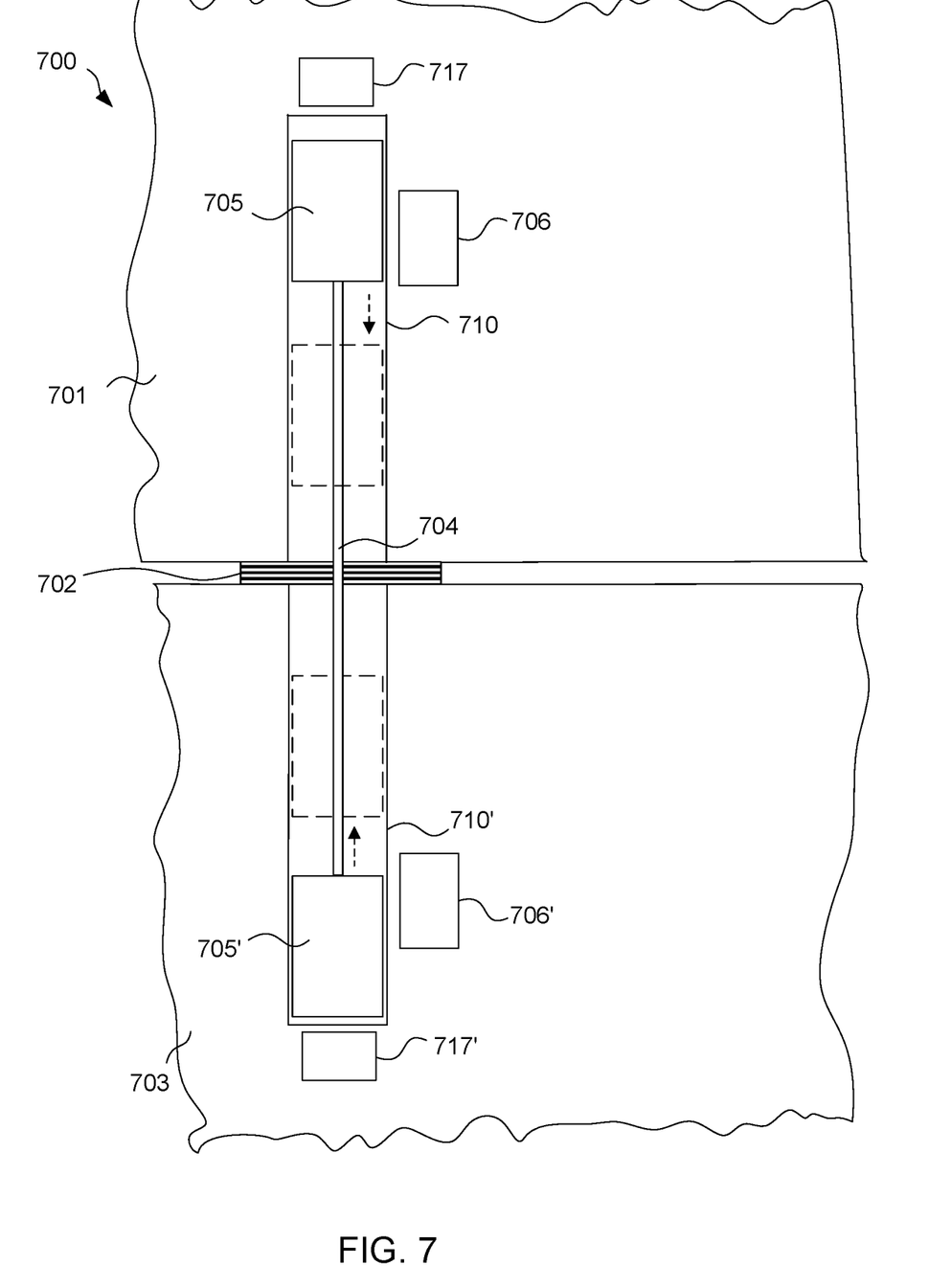
FIG. 7 illustrates a schematic top view of an electronic device in a flat position.

FIG. 7 illustrates a sectional view of an embodiment of an electronic device 700. In this embodiment, the electronic device 700 comprises a hinge element 702 that connects the first and second portion 701, 703 along a part of the edges of the first and second portion. In this embodiment, neither end of the non-extensible element 704 is fixed with respect to either the first portion 701 or the second portion 703. In other words, the entire non-extensible element 704 may be movable with respect to the first and second portion 701, 703. However, according to an embodiment, a part of the non-extensible element 704 may be fixed with respect to the first portion 701, the second portion 703 or both using a suitable attachment arrangement. For example, the non-extensible element 704 may be fixed at its central part to a part of the hinge element 702. This embodiment differs from the embodiments illustrated in FIGS. 2 to 6 at least in that the non-extensible element comprises a first movable portion, in this exemplary embodiment a first movable element 705, configured so that a rotation of the first portion 701 with respect to the second portion 703 causes motion of the first movable element 705 with respect to the first portion 701, and a second movable portion, in this exemplary embodiment a second movable element 705', configured so that a rotation of the first portion 701 with respect to the second portion 701 causes motion of the second movable element 705' with respect to the second portion 703. Each of the movable elements 705 and 705' has, in this embodiment, a guide structure 710 and 710' within the first and second portion 701 and 703, respectively.

The electronic device 700 further comprises a first sensor arrangement 706 disposed on the first portion 701, the first sensor arrangement 706 being configured to detect the motion of the first movable portion 705, and a second sensor arrangement 706' disposed on the second portion 703, the second sensor arrangement 706' being configured to detect the motion of the second movable portion 705'.

In order to prevent uncontrolled movement of the first and second movable elements 705 and 705' and of the entire non-extensible element 704 in the direction of its length, the electronic device comprises a first restricting arrangement 717 configured to restrict the movement of the first movable element 705 and a second restricting arrangement 717' configured to restrict the movement of the second movable element 705'. The restricting arrangements 717, 717' may be any restricting arrangements described in this specification and may be independently selected from any restricting arrangements described in this specification. They may be adjusted in a suitable manner so that the movable elements 705 and 705' are configured to move with respect the first and second portions 701 and 703, respectively, but so that the entire non-extensible element 704 does not move in a significant manner in the direction of its length with respect to e.g. the hinge element 702.

In this embodiment, the electronic device may calculate an angle of fold between the first and second portion 701, 703 based on the motion of the first and second movable element 705, 705' as detected by the first and second sensor arrangement 706, 706'. As the first and second sensor arrangement 706, 706' may be configured to detect the motion of the first and second movable portion 705, 705' independently, the data obtainable from both sensor arrangements 706, 706', i.e. two data points, may provide a more reliable detection and a more reliable calculation of an angle of fold between the first and second portion 701, 703. The sensor arrangements 706, 706' in this embodiment may be selected independently from any sensor arrangements described in this specification, including any one of those described in FIGS. 3 to 6. In an embodiment, the first and second sensor arrangements 706, 706' are the same. In an embodiment, the first and second sensor arrangements 706, 706' are different from each other.

In an embodiment, the first sensor arrangement 706 and/or the second sensor arrangement 706' is/are a magnetic sensor arrangement. In such an embodiment, the first and/or second movable element 705 is a magnetic element.

The magnetic sensor arrangement may comprise a magnetic sensor. In this exemplary embodiment, the magnetic sensor 706, 706' is disposed along a longitudinal axis of motion of the movable portion or element 705, i.e. at the lateral side of the guide structure 710. According to an embodiment, the magnetic sensor 706, 706' is disposed at the longitudinal end of the guide structure 710. The magnetic sensor arrangement 706, 706' may comprise a Hall effect sensor capable of detecting a change in magnetic field. An angle of fold between the first and second portions may thus be calculated based on the change in the magnetic field as determined by the magnetic sensor arrangement(s) 706, 706'. Other aspects of the embodiment shown in FIG. 7 are generally similar to those of the embodiments shown in FIGS. 2, 3, 4, 5 and 6.

Figure 8:
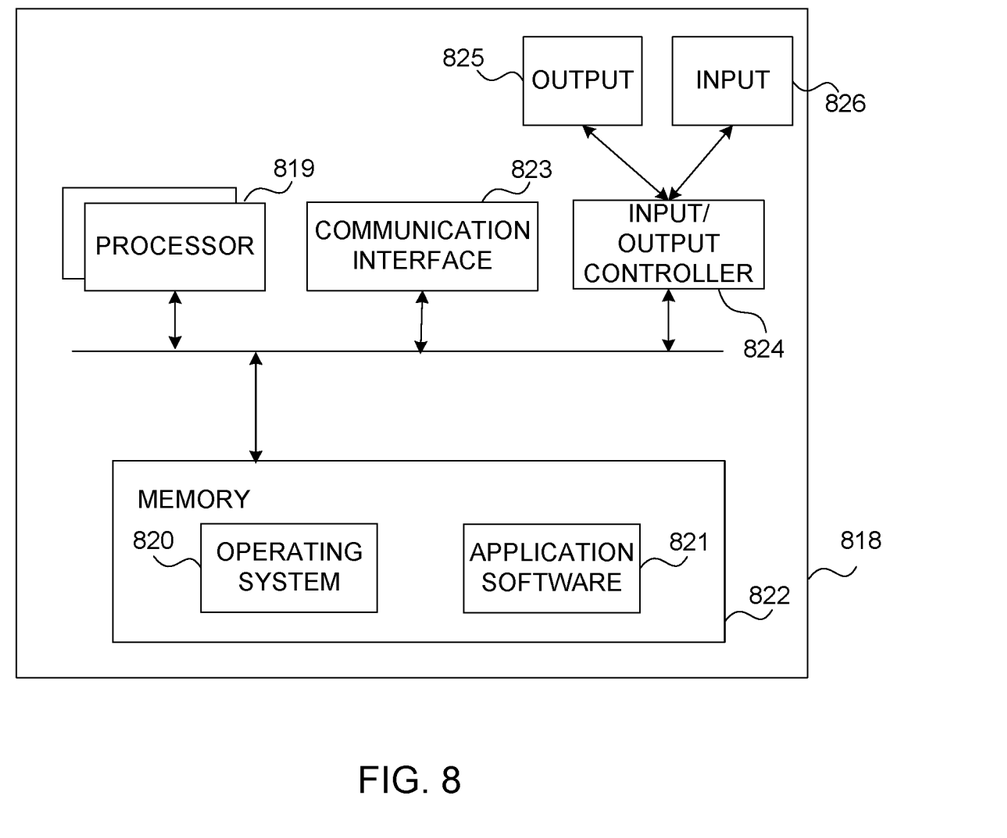
FIG. 8 illustrates a computing apparatus according to an embodiment as a functional block diagram.

FIG. 8 illustrates an embodiment of components of a computing apparatus 818 which may be implemented as a part of an electronic device according to one or more embodiments described in this specification. The computing apparatus 818 comprises one or more processors 819 which may be microprocessors, controllers or any other suitable type of processors for processing computer executable instructions to control the operation of the electronic device 800. Platform software comprising an operating system 820 or any other suitable platform software may be provided on the apparatus 818 to enable application software 821 to be executed on the device. According to an embodiment, the calculation of an angle of fold of the electronic device may be accomplished by software. Furthermore, it may receive information from the sensor arrangement regarding the distance X, relative position and/or the motion of the movable portion. Consequently, it may convert this information into the angle of fold. In embodiments in which the electronic device comprises a touch sensitive display or other type of display configured to provide a graphical user interface, the computing apparatus 818 may be configured to transform at least one characteristic of the graphical user interface presented on the display based on the angle of fold and/or a change in the angle of fold between the first portion and the second portion.

Computer executable instructions may be provided using any computer-readable media that are accessible by the computing apparatus 818. Computer-readable media may include, for example, computer storage media such as a memory 822 and communications media. Computer storage media, such as a memory 822, include volatile and non-volatile, removable and non-removable media implemented in any method or technology for storage of information such as computer readable instructions, data structures, program modules or other data. Computer storage media include, but are not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing apparatus. In contrast, communication media may embody computer readable instructions, data structures, program modules, or other data in a modulated data signal, such as a carrier wave, or other transport mechanism. As defined herein, computer storage media do not include communication media. Therefore, a computer storage medium should not be interpreted to be a propagating signal per se. Propagated signals per se are not examples of computer storage media. Although the computer storage medium (the memory 822) is shown within the computing apparatus 818, it will be appreciated by a person skilled in the art, that the storage may be distributed or located remotely and accessed via a network or other communication link (e.g. using a communication interface 823).

The computing apparatus 818 may comprise an input/output controller 824 configured to output information to one or more output devices 825, for example a display or a speaker, which may be separate from or integral to the electronic device. The input/output controller 824 may also be configured to receive and process an input from one or more input devices 826, for example, a keyboard, a microphone or a touchpad. In one embodiment, the output device 825 may also act as the input device. An example of such a device may be a touch sensitive display. The input/output controller 824 may also output data to devices other than the output device, e.g. a locally connected printing device.

The functionality described herein can be performed, at least in part, by one or more hardware logic components. According to an embodiment, the computing apparatus 818 is configured by the program code when executed by the processor 819 to execute the embodiments of the operations and functionality described. Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Program-specific Standard Products (ASSPs), System-on-a-chip systems (SOCs), Complex Programmable Logic Devices (CPLDs), Graphics Processing Units (GPUs).

Some embodiments are further discussed shortly in the following.

In an embodiment, an electronic device may comprise a first portion; a second portion; a hinge element or a folding element disposed between the first portion and the second portion so that the first portion is rotatable with respect to the second portion; a non-extensible element disposed between the first portion and the second portion, wherein the non-extensible element comprises a movable portion configured so that a rotation of the first portion with respect to the second portion causes motion of the movable portion with respect to the first portion; and a sensor arrangement disposed on the first portion, the sensor arrangement being configured to detect the motion of the movable portion; at least one processor; and at least one memory comprising computer program code, the at least one memory and the computer program code configured to, with the at least one processor, cause the electronic device to at least perform: calculate an angle of fold between the first and second portion based on the motion of the movable portion as detected by the sensor arrangement.

In an embodiment which may be in accordance with the preceding embodiment, the electronic device comprises a guide structure, and the movable portion is movable along the guide structure.

In an embodiment which may be in accordance with any of the preceding embodiments, the movable portion is movable in the direction of the length of the non-extensible element.

In an embodiment which may be in accordance with any of the preceding embodiments, the sensor arrangement comprises a sensor that is disposed along a longitudinal axis of motion of the movable portion.

In an embodiment which may be in accordance with any of the preceding embodiments, the sensor arrangement is an electrical sensor configured to measure an electrical quantity.

In an embodiment which may be in accordance with any of the preceding embodiments, the first portion comprises at least one electrically conductive element; the movable portion is electrically conductive or dielectric and configured to move with respect to the at least one conductive element; and the electrical sensor arrangement is configured to measure the electrical quantity across the movable portion and the at least one conductive element.

In an embodiment which may be in accordance with any of the preceding embodiments, the electrical quantity is resistance or capacitance.

In an embodiment which may be in accordance with any of the preceding embodiments, the sensor arrangement is an optical sensor arrangement.

In an embodiment which may be in accordance with any of the preceding embodiments, the electronic device is configured to cause a change in an optical property upon motion of the movable portion with respect to the first portion, and the optical sensor arrangement is configured to detect the change in the optical property.

In an embodiment which may be in accordance with any of the preceding embodiments, the first portion or the guide structure has at least one marking, wherein the movable portion is configured to move with respect to the at least one marking; and the optical sensor arrangement is configured to detect the relative position or the motion of the movable portion with respect to the at least one marking.

In an embodiment which may be in accordance with any of the preceding embodiments, the first portion comprises at least one source of light configured to emit light, the movable portion is configured to move with respect to the at least one source of light, and the optical sensor arrangement is configured to detect a change in the light reaching the optical sensor arrangement upon motion of the movable portion with respect to the first portion.

In an embodiment which may be in accordance with any of the preceding embodiments, the sensor arrangement is a proximity sensor arrangement.

In an embodiment which may be in accordance with any of the preceding embodiments, the electronic device further comprises a display.

In an embodiment which may be in accordance with any of the preceding embodiments, the display is configured to present a user interface, and wherein the at least one memory and the computer program code are configured to, with the at least one processor, cause the electronic device to at least perform: transform at least one characteristic of the graphical user interface presented on the display based on a change in the angle of fold between the first portion and the second portion.

In an embodiment which may be in accordance with any of the preceding embodiments, the first portion comprises a restricting arrangement configured to restrict the movement of the movable portion.

In an embodiment which may be in accordance with any of the preceding embodiments, the non-extensible element is fixed with respect to the second portion.

In an embodiment which may be in accordance with any of the preceding embodiments, at least a part of the non-extensible element is disposed within the hinge element.

In an embodiment which may be in accordance with any of the preceding embodiments, the electronic device is a mobile device.

In an embodiment which may be in accordance with any of the preceding embodiments, the mobile device comprises a first portion; a second portion; a folding element disposed between the first portion and the second portion so that the first portion is rotatable with respect to the second portion; a non-extensible element disposed between the first portion and the second portion, wherein the non-extensible element comprises a movable portion configured so that a rotation of the first portion with respect to the second portion causes motion of the movable portion with respect to the first portion; and a sensor arrangement disposed on the first portion, the sensor arrangement being configured to detect the motion of the movable portion; at least one processor; and at least one memory comprising computer program code, the at least one memory and the computer program code configured to, with the at least one processor, cause the mobile device to at least perform: calculate an angle of fold between the first and second portion based on the motion of the movable portion as detected by the sensor arrangement.

In an embodiment which may be in accordance with any of the preceding embodiments, the electronic device or mobile device further comprises a touch sensitive display providing a graphical user interface, wherein the at least one memory and the computer program code are configured to, with the at least one processor, cause the mobile device to at least perform: transform at least one characteristic of the graphical user interface presented on the touch sensitive display based on a change in the angle of fold between the first portion and the second portion.

In an embodiment which may be in accordance with any of the preceding embodiments, the electronic device comprises a first portion; a second portion; a hinge element disposed between the first portion and the second portion so that the first portion is rotatable with respect to the second portion; a non-extensible element disposed between the first portion and the second portion, wherein the non-extensible element comprises a first movable portion configured so that a rotation of the first portion with respect to the second portion causes motion of the first movable portion with respect to the first portion; and a second movable portion configured so that a rotation of the first portion with respect to the second portion causes motion of the second movable portion with respect to the second portion; a first sensor arrangement disposed on the first portion, the first sensor arrangement being configured to detect the motion of the first movable portion; and a second sensor arrangement disposed on the second portion, the second sensor arrangement being configured to detect the motion of the second movable portion; at least one processor; and at least one memory comprising computer program code, the at least one memory and the computer program code configured to, with the at least one processor, cause the electronic device to at least perform: calculate an angle of fold between the first and second portion based on the motion of the movable portion as detected by the first and second sensor arrangement.

In an embodiment which may be in accordance with any of the preceding embodiments, the first portion comprises a first restricting arrangement configured to restrict the movement of the first movable portion, and the second portion comprises a second restricting arrangement configured to restrict the movement of the second movable portion.

In an embodiment which may be in accordance with any of the preceding embodiments, the at least one of the first and second sensor arrangements is a magnetic sensor arrangement, and the movable portion comprises a magnetic element.

In an embodiment which may be in accordance with any of the preceding embodiments, the magnetic sensor arrangement comprises a Hall effect sensor.

Although some of the present embodiments may be described and illustrated as being implemented in a smartphone, a mobile phone, or a tablet computer, these are only examples of a device and not a limitation. As those skilled in the art will appreciate, the present embodiments are suitable for application in a variety of different types of devices, such as portable and mobile devices, for example, in laptop computers, tablet computers, game consoles or game controllers, various wearable devices, etc.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The embodiments illustrated and described herein as well as embodiments not specifically described herein but within the scope of aspects of the claims constitute exemplary means for hinging a first and a second portion of an electronic device. Hinge elements 102, 202, 302, 402, 502, 602 and 702 illustrate exemplary hinging means for hinging the first and second portions relative to each other. The non-extensible elements 204, 304, 404, 504, 604 and 704 illustrate exemplary non-extensible means disposed between the first portion and the second portion, and the movable elements or movable portions 205, 305, 405, 505, 605 and 705 illustrate exemplary moving means configured so that a rotation of the first portion with respect to the second portion causes motion of the movable portion with respect to the first portion. The illustrated sensors (having e.g. reference numerals 208, 412) and sensor arrangements 206, 406, 506, 606, 706, 706' and optical sensor arrangements constitute exemplary sensing means for detecting the motion of the moving means. The illustrated one or more processors 819 together with the computer program code stored in memory 822 constitute exemplary calculation means for calculating an angle of fold between the first and second portion based on the motion of the moving means as detected by the sensing means.

The term "comprising" is used in this specification to mean including the feature(s) or act(s) followed thereafter, without excluding the presence of one or more additional features or acts.

The invention claimed is:

1. An electronic device comprising:
   a first portion;
   a second portion;
   a guide structure within at least one of the first and second portions;
   a hinge element disposed between the first portion and the second portion so that the first portion is rotatable with respect to the second portion;
   a non-extensible element disposed between the first portion and the second portion, wherein the non-extensible element is bendable and comprises a movable portion configured so that a rotation of the first portion with respect to the second portion causes motion of the movable portion within and longitudinally relative to the guide structure and with respect to the first portion, wherein the movable portion is movable in a direction of a length of the non-extensible element and the non-extensible element is configured to apply a pulling force or a pushing force on the movable portion when flexed by the first portion being rotated with respect to the second portion, and the guide structure comprises a channel and rotation of the first portion with respect to the second portion causes motion of the movable portion along and relative to an inner surface of the channel of the guide structure;
   a sensor arrangement disposed on the first portion, the sensor arrangement being configured to detect the motion of the movable portion;
   at least one processor; and
   at least one memory comprising computer program code, the at least one memory and the computer program code configured to, with the at least one processor, cause the electronic device to at least perform:
   calculate an angle of fold between the first and second portion based on the motion of the movable portion as detected by the sensor arrangement.

2. An electronic device as defined in claim 1, wherein the non-extensible element is non-compressible to retain a length thereof upon rotation of the first portion with respect to the second portion.

3. An electronic device as defined in claim 1, wherein the movable portion comprises one of grooves or raised lines on one or more surfaces of the movable portion, and further comprising corresponding grooves or raised lines in at least one surface inside or on the guide structure.

4. An electronic device as defined in claim 1, wherein the sensor arrangement comprises a sensor that is disposed along a longitudinal axis of motion of the movable portion.

5. An electronic device as defined in claim 1, wherein the sensor arrangement is an electrical sensor configured to measure an electrical quantity.

6. An electronic device as defined in claim 5, wherein the first portion comprises at least one electrically conductive element; the movable portion is electrically conductive or dielectric and configured to move with respect to the at least one conductive element; and the electrical sensor arrangement is configured to measure the electrical quantity across the movable portion and the at least one conductive element.

7. An electronic device as defined in claim 5, wherein the electrical quantity is resistance or capacitance.

8. An electronic device as defined in claim 1, wherein in the sensor arrangement is an optical sensor arrangement.

9. An electronic device as defined in claim 1, wherein in the electronic device is configured to cause a change in an optical property upon motion of the movable portion with respect to the first portion, and the optical sensor arrangement is configured to detect the change in the optical property.

10. An electronic device as defined in claim 1, wherein the sensor arrangement is a proximity sensor arrangement.

11. An electronic device as defined in claim 1, further comprising a display, wherein the display is configured to present a user interface, and wherein the at least one memory and the computer program code are configured to, with the at least one processor, cause the electronic device to at least perform: transform at least one characteristic of the graphical user interface presented on the display based on a change in the angle of fold between the first portion and the second portion.

12. An electronic device as defined in claim 1, wherein the guide structure comprises a passage configured to restrict the movement of the movable portion in a lateral direction.

13. An electronic device as defined in claim 1, wherein the non-extensible element is fixed with respect to the second portion.

14. An electronic device as defined in claim 1, wherein at least a part of the non-extensible element is disposed within the hinge element and the non-extensible element extends along or within at least a part of the first and second portions.

15. A mobile device comprising:
a first portion;
a second portion;
a guide structure within at least one of the first and second portions;
a folding element disposed between the first portion and the second portion so that the first portion is rotatable with respect to the second portion;
a non-extensible element disposed between the first portion and the second portion, wherein the non-extensible element is bendable and comprises a movable portion configured so that a rotation of the first portion with respect to the second portion causes motion of the movable portion within and longitudinally relative to the guide structure and with respect to the first portion, wherein the movable portion is movable in a direction of a length of the non-extensible element and the non-extensible element is configured to apply a pulling force or a pushing force on the movable portion when flexed by the first portion being rotated with respect to the second portion, and the guide structure comprises a channel and rotation of the first portion with respect to the second portion causes motion of the movable portion along and relative to an inner surface of the channel of the guide structure;
a sensor arrangement disposed on the first portion, the sensor arrangement being configured to detect the motion of the movable portion;
at least one processor; and
at least one memory comprising computer program code, the at least one memory and the computer program code configured to, with the at least one processor, cause the mobile device to at least perform:
calculate an angle of fold between the first and second portion based on the motion of the movable portion as detected by the sensor arrangement.

16. A mobile device as defined in claim 15, further comprising a touch sensitive display providing a graphical user interface, wherein the at least one memory and the computer program code are configured to, with the at least one processor, cause the mobile device to at least perform: transform at least one characteristic of the graphical user interface presented on the touch sensitive display based on a change in the angle of fold between the first portion and the second portion.

17. An electronic device comprising:
a first portion;
a second portion;
a guide structure within the first and second portions;
a hinge element disposed between the first portion and the second portion so that the first portion is rotatable with respect to the second portion;
a non-extensible element disposed between the first portion and the second portion,
wherein the non-extensible element is bendable and comprises a first movable portion configured so that a rotation of the first portion with respect to the second portion causes motion of the first movable portion within and longitudinally relative to the guide structure and with respect to the first portion; and a second movable portion configured so that a rotation of the first portion with respect to the second portion causes motion of the second movable portion within and longitudinally relative to the guide structure and with respect to the second portion, wherein the first and second movable portions are movable in a direction of a length of the non-extensible element and the non-extensible element is configured to apply a pulling force or a pushing force on the first and second movable portions when flexed by the first portion being rotated with respect to the second portion, and the guide structure comprises a channel and rotation of the first portion with respect to the second portion causes motion of the first and second movable portions along and relative to an inner surface of the channel of the guide structure;
a first sensor arrangement disposed on the first portion, the first sensor arrangement being configured to detect the motion of the first movable portion; and a second sensor arrangement disposed on the second portion, the second sensor arrangement being configured to detect the motion of the second movable portion;
at least one processor; and
at least one memory comprising computer program code, the at least one memory and the computer program code configured to, with the at least one processor, cause the electronic device to at least perform:
calculate an angle of fold between the first and second portion based on the motion of the movable portion as detected by the first and second sensor arrangement.

18. An electronic device as defined in claim 17, wherein the first portion comprises a first restricting arrangement configured to restrict the movement of the first movable portion, and the second portion comprises a second restricting arrangement configured to restrict the movement of the second movable portion.

19. An electronic device as defined in claim 17, wherein at least one of the first and second sensor arrangements is a magnetic sensor arrangement, and the movable portion comprises a magnetic element.

20. An electronic device as defined in claim 19, wherein the magnetic sensor arrangement comprises a Hall effect sensor.

* * * * *